United States Patent
Logan et al.

(10) Patent No.: US 9,318,622 B1
(45) Date of Patent: Apr. 19, 2016

(54) FIN-TYPE PIN DIODE ARRAY

(71) Applicant: International Business Machines Corporation, Armonk, NY (US)

(72) Inventors: Lyndon R. Logan, Poughkeepsie, NY (US); Edward J. Nowak, Essex Junction, VT (US); Robert R. Robison, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/747,732

(22) Filed: Jun. 23, 2015

(51) Int. Cl.
| | |
|---|---|
| H01L 31/00 | (2006.01) |
| H01L 29/868 | (2006.01) |
| H01L 27/08 | (2006.01) |
| H01L 29/16 | (2006.01) |
| H01L 27/146 | (2006.01) |
| H01L 31/105 | (2006.01) |
| H01L 31/0368 | (2006.01) |
| H01L 29/66 | (2006.01) |
| H01L 21/02 | (2006.01) |

(52) U.S. Cl.
CPC ........ *H01L 29/868* (2013.01); *H01L 21/02532* (2013.01); *H01L 21/02595* (2013.01); *H01L 21/02672* (2013.01); *H01L 27/0814* (2013.01); *H01L 27/14643* (2013.01); *H01L 29/16* (2013.01); *H01L 29/6609* (2013.01); *H01L 29/66545* (2013.01); *H01L 31/03685* (2013.01); *H01L 31/105* (2013.01)

(58) Field of Classification Search
CPC ................ H01L 29/868; H01L 21/845; H01L 21/02532; H01L 21/02672
USPC .......................................................... 257/443
See application file for complete search history.

(56) References Cited

U.S. PATENT DOCUMENTS

| | | | |
|---|---|---|---|
| 3,504,131 | A | 3/1970 | Slana et al. |
| 6,195,187 | B1 | 2/2001 | Soref et al. |
| 6,831,263 | B2 | 12/2004 | Skurnik et al. |
| 6,943,409 | B1 | 9/2005 | Cheng et al. |
| 6,952,003 | B2 | 10/2005 | Skurnik et al. |
| 7,560,784 | B2 | 7/2009 | Cheng et al. |
| 7,601,556 | B2 | 10/2009 | Wilson et al. |
| 8,003,477 | B2 | 8/2011 | Herner |
| 8,018,019 | B2 | 9/2011 | Wicks |
| 8,119,434 | B2 | 2/2012 | Cohen |
| 8,207,520 | B2 | 6/2012 | Yang et al. |

(Continued)

FOREIGN PATENT DOCUMENTS

| | | |
|---|---|---|
| WO | 2013079447 A1 | 6/2013 |

*Primary Examiner* — Luan C Thai
(74) *Attorney, Agent, or Firm* — Gibb & Riley, LLC; Steven J. Meyers, Esq.

(57) ABSTRACT

Structures and methods of manufacturing a fin-type PIN diode array include forming a plurality of first charge-type doped silicon fins disposed in parallel on a planar substrate in a first direction, forming undoped epitaxial growths of silicon at intervals along a length of each silicon fin, where each epitaxial growth includes a depleted intrinsic region, and forming a plurality of second charge-type doped polysilicon fins disposed in parallel and disposed perpendicularly to the first direction. The polysilicon fins are formed to contact, at intervals along a length of each polysilicon fin, an uppermost surface of one of the undoped epitaxial growths of silicon, to form a PIN diode at each intersection of each of the first charge-type doped silicon fins and the second charge-type doped polysilicon fins.

20 Claims, 10 Drawing Sheets

(56) References Cited

U.S. PATENT DOCUMENTS

| | | |
|---|---|---|
| 8,242,568 B2 | 8/2012 | Ikeda et al. |
| 8,450,156 B2 * | 5/2013 | Gossner .................. H01L 21/84 257/336 |
| 8,633,567 B2 | 1/2014 | Herner |
| 9,006,054 B2 * | 4/2015 | Cheng ................. H01L 27/0255 257/350 |
| 9,093,566 B2 * | 7/2015 | Fan ................... H01L 29/66136 |
| 2007/0018192 A1 | 1/2007 | Salzman et al. |

* cited by examiner

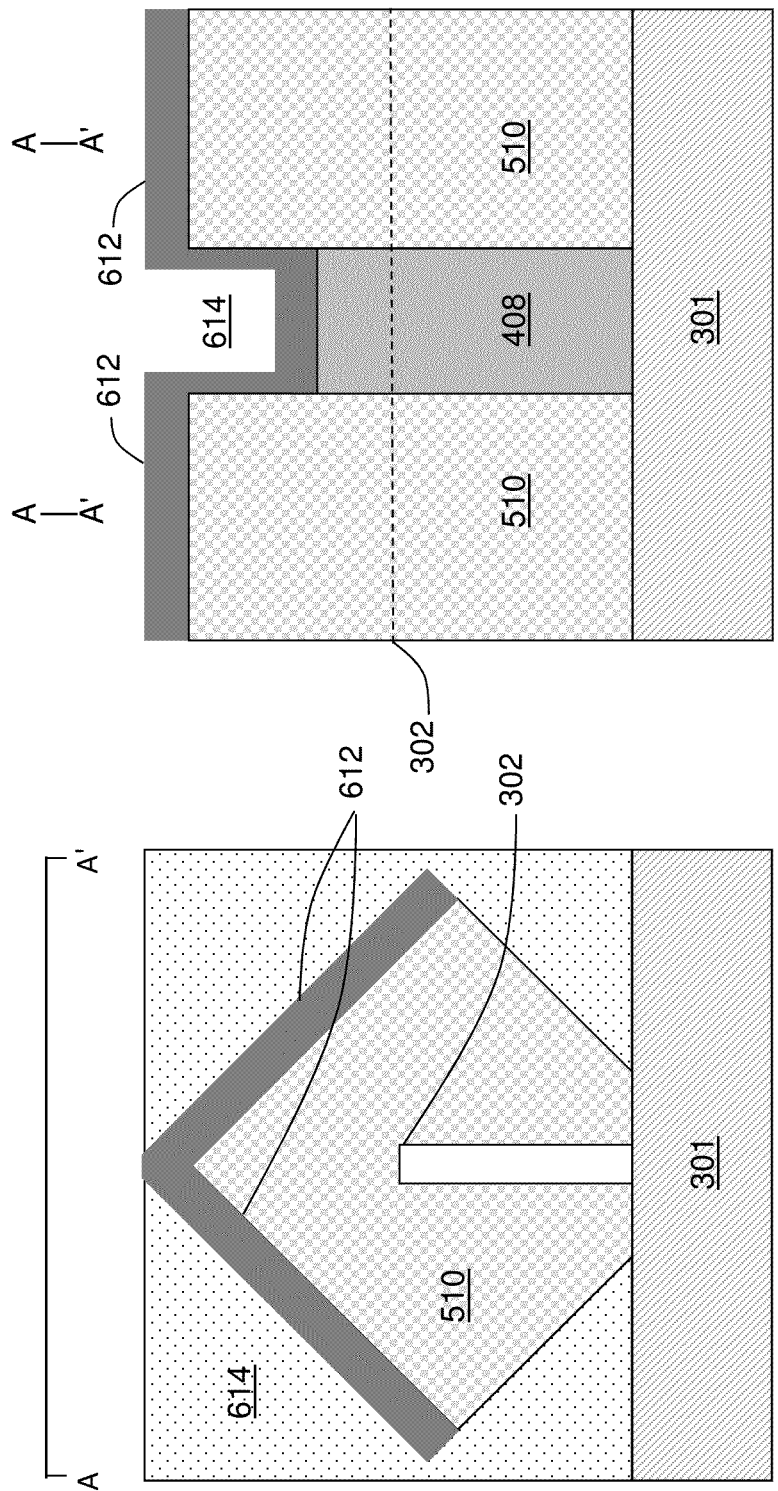

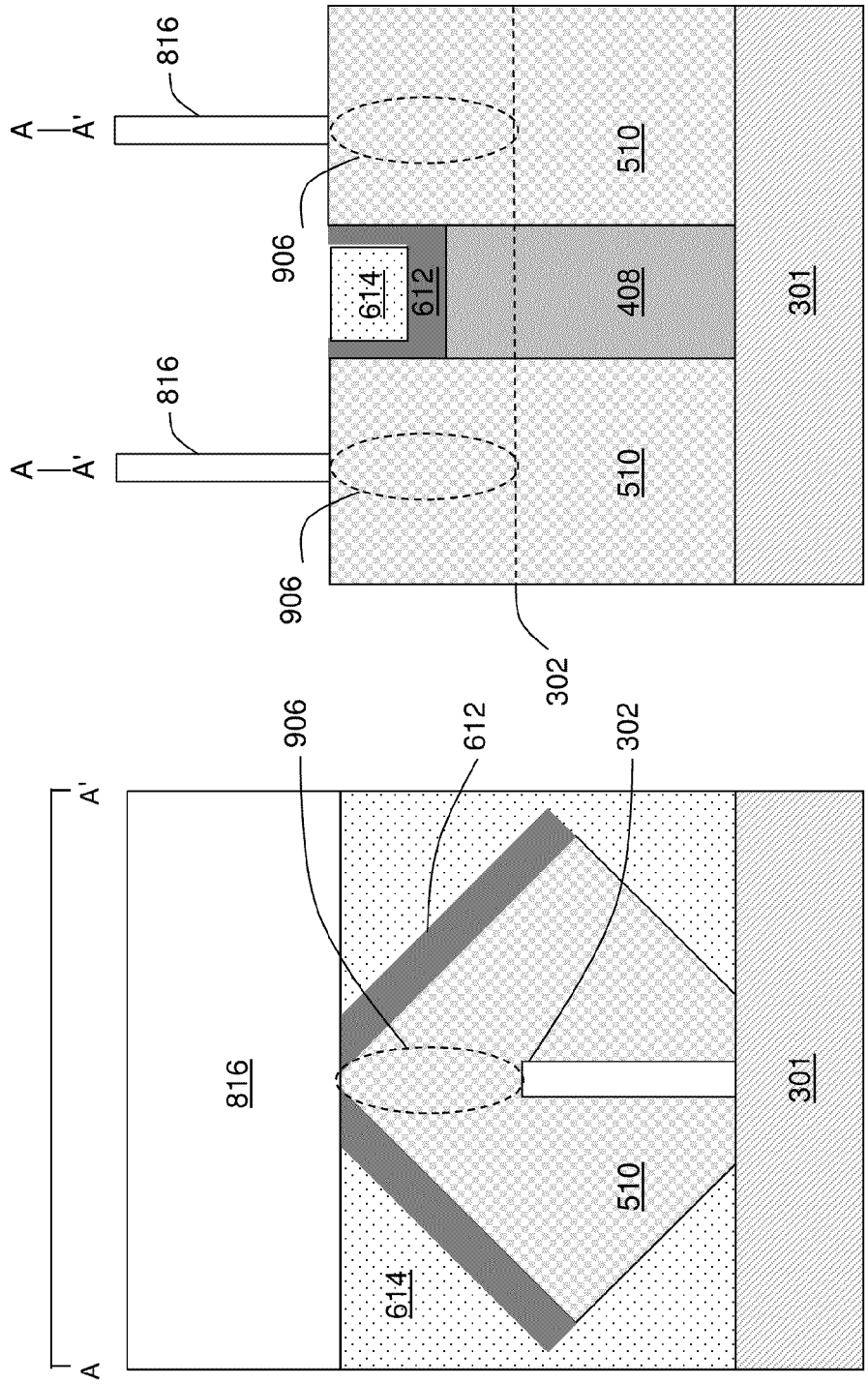

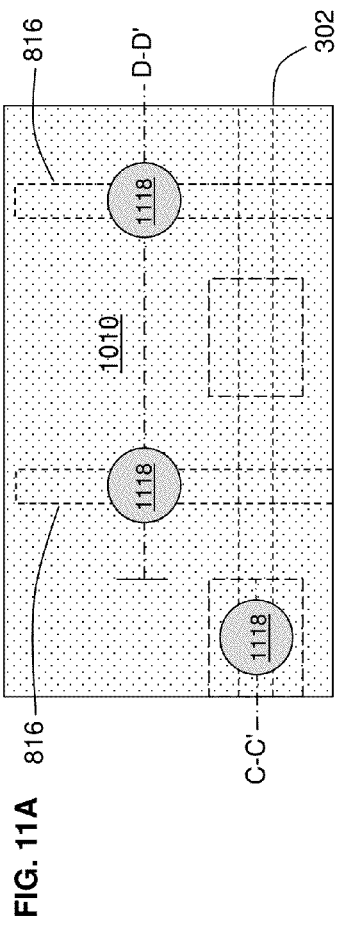
FIG. 11A
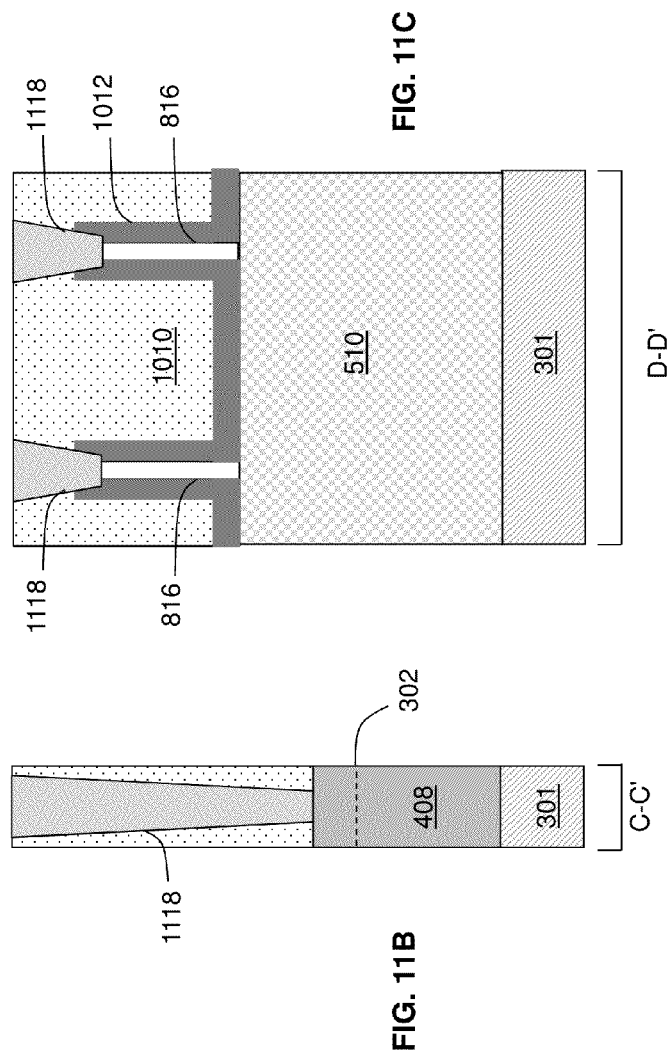
FIG. 11B
FIG. 11C

FIN-TYPE PIN DIODE ARRAY

BACKGROUND

The present disclosure relates to structures and methods of making an array of fin-type PIN diodes.

A PIN diode is a semiconductor diode with a wide, undoped intrinsic region disposed between a p-type doped semiconductor region and an n-type doped semiconductor region. The p-type and n-type regions are typically heavily doped because they are used as ohmic contacts. The wide intrinsic region contrasts with that of a conventional p-n junction diode. The wide intrinsic region makes the PIN diode an inferior rectifier, but makes it a suitable photodetector.

As a photodetector, the PIN diode is reverse biased, carrying only a small dark current or $I_s$ leakage. The reverse bias enhances a depletion region of the PIN photodiode that extends across the intrinsic region and deep into the device. When a photon of sufficient energy enters the depletion region of the PIN diode, it creates an electron-hole pair. The reverse bias field then sweeps the charge carriers out of the depletion region, creating a current.

The most common PIN diodes are based on silicon. The silicon PIN diodes are sensitive from about 1100 nm to about 250 nm, corresponding to the near IR spectrum, the visible spectrum and the near UV spectrum. A commercially available silicon photodiode array can include 16 silicon PIN photodiodes and have a total photosensitive area of about 1.175 mm×2.0 mm.

A semiconductor manufacturing process is characterized by its technology node, which relates to the minimum distance between adjacent identical structures of an integrated circuit (IC) chip that can be manufactured by the particular process. For example, the 45 nm technology node refers to the average half-pitch of a memory cell manufactured by the process, according to the International Technology Roadmap for Semiconductors. Semiconductor manufacture is accomplished by photolithographic processes that transfer geometric shapes from a photomask to an underlying surface of a semiconductor wafer, forming the semiconductor devices of an IC chip. In general, semiconductor manufacturers seek to decrease the size of manufactured IC chips by photolithographic processes using increasingly smaller technology nodes, to reduce costs and power consumption.

Currently, a frequently used type of transistor in the manufacture of IC chips is a fin-type field effect transistor (FinFET) that reduces the size or area of the transistor in the horizontal plane by introducing vertical semiconductor elements, such as, a vertical fin-type gate, a vertical doped source and a vertical doped drain. Decreasing the area of the transistor on the chip allows the manufacturer to greatly increase the number of device on the chip, i.e., to increase the density of devices on the chip. The photolithographic manufacturing process of vertical FinFET semiconductor elements is well understood and can be used in the manufacture of other vertical semiconductor devices.

There remains a need to increase the device density of a PIN diode array on an IC chip.

SUMMARY

In an embodiment of the disclosure, a structure of a fin-type PIN diode array may include silicon fins disposed in parallel on a planar substrate in a first direction, each silicon fin being doped with ions of a first electrical charge. The structure may also include undoped epitaxial growths of silicon disposed at intervals along a length of each silicon fin, each undoped epitaxial growth covering both sides and a top surface of a portion of each silicon fin and including a depleted intrinsic region that electrically contacts each silicon fin. Finally, the structure may include polysilicon fins disposed in parallel in a second direction, perpendicular to the first direction, where each of the polysilicon fins is doped with ions of a second electrical charge and electrically contacts at intervals along a length of each polysilicon fin an uppermost surface of one of the undoped epitaxial growths of silicon.

In an embodiment of the disclosure, a structure of a PIN photodetector array may include a first set of parallel silicon fins oriented in a first direction, doped with ions of a first electrical charge, and formed on a substrate. The structure may also include a second set of parallel polysilicon fins oriented to cross the first direction, doped with ions of a second electrical charge, and formed above the first set of parallel silicon fins. Finally, the structure may include a set of intrinsic semiconductor regions connecting each of the first set of parallel silicon fins and each of the second set of parallel polysilicon fins, where each of the parallel silicon fins and the parallel polysilicon fins cross each other in the PIN photodetector array.

In another embodiment of the disclosure, a method of manufacturing an array of PIN diodes may include forming parallel silicon fins, doped with ions of a first electrical charge, on a planar substrate. The method may also include forming polysilicon dummy gates at intervals along each silicon fin. The method may further include forming undoped epitaxial silicon growths that alternate with said polysilicon dummy gates and exceed a height of each polysilicon dummy gate. The method may yet further include depositing a polysilicon layer, doped with ions of a second electrical charge, that contacts an uppermost portion of each undoped epitaxial silicon growth. The method may yet further include annealing the polysilicon layer to cause re-crystallization seeded from the uppermost portion of each undoped epitaxial silicon growth. Finally, the method may include patterning the polysilicon layer to form parallel polysilicon fins that are perpendicular to the parallel silicon fins, each of the parallel polysilicon fins contacting at intervals along its length the undoped epitaxial silicon growths, each of the undoped epitaxial silicon growths containing a depleted intrinsic region that contacts an overlying one of the parallel polysilicon fins and an underlying one of the parallel silicon fins, to form a single PIN structure in an array of PIN diodes.

BRIEF DESCRIPTION OF THE DRAWINGS

The embodiments herein will be better understood from the following detailed description with reference to the drawings, which are not necessarily drawn to scale and in which:

FIG. 6A is a schematic diagram illustrating a cross section of a nitride liner and an oxide fill formed on an undoped epitaxial growth of silicon in embodiments herein;

FIG. 6B is a schematic diagram illustrating a side view of the nitride liner formed on the length of silicon fin covered by polysilicon gates and undoped epitaxial growths of silicon in embodiments herein;

FIG. 9A is a schematic diagram illustrating a cross section of a re-crystallized polysilicon fin formed on the uppermost exposed portion of an epitaxial growth of silicon in embodiments herein;

FIG. 9B is a schematic diagram illustrating a side view of the re-crystallized polysilicon fin formed on the uppermost exposed portion of an epitaxial growth of silicon in embodiments herein;

FIG. 11A is a schematic diagram illustrating a top view of metal contacts for a PIN array in embodiments herein;

FIG. 11B is a schematic diagram illustrating a side view of a metal contact that contacts a silicon fin of the PIN array in embodiments herein;

FIG. 11C is a schematic diagram illustrating a side view of a metal contact that contacts a polysilicon fin of the PIN array in embodiments herein.

DETAILED DESCRIPTION

As stated above, there remains a need to increase the device density of a PIN diode array on an IC chip.

Figure 1:
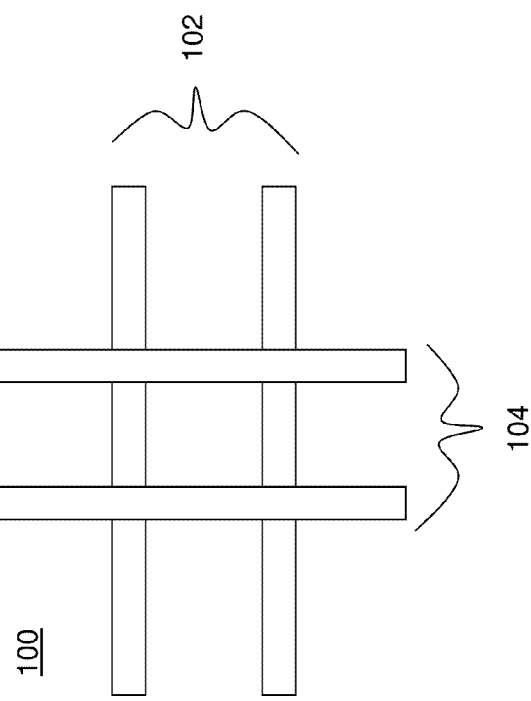
FIG. 1 is a schematic diagram illustrating a top view of an array of cross connects in embodiments herein.
Figure 2:
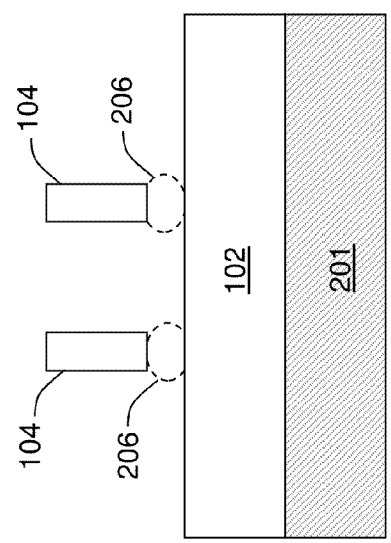
FIG. 2 is a schematic diagram illustrating a side view of vertical PIN diodes in embodiments herein.

Referring to the exemplary top view of FIG. 1, a first plurality of parallel semiconductor fins 102, doped with ions of a first electrical charge, may be formed on a planar substrate (not shown), and a second plurality of parallel semiconductor fins 104, doped with ions of a second electrical charge, where the polarity of the second electrical charge is opposite to the polarity of the first electrical charge, i.e., n-type vs. p-type, may be formed above and oriented perpendicularly to the first plurality of parallel semiconductor fins, to form an array of cross connects 100. As illustrated in the exemplary side view of FIG. 2, each of the second plurality of parallel semiconductor fins 104 may be formed on one of a plurality of depleted intrinsic semiconductor regions 206 that are formed at intervals along the length of each of the first plurality of parallel semiconductor fins 102. The first plurality of parallel semiconductor fins 102 may be formed on a planar substrate 201 of one of: bulk silicon and the insulator layer of a silicon-on-insulator (SOI) substrate. The vertical structure comprising a portion of a first charge-type doped semiconductor fin 104 that is formed on and above an underlying depleted intrinsic semiconductor region 206, which in turn is formed on an underlying portion of a second charge-type doped semiconductor fin 102 forms a PIN diode at each cross connect of the array 100.

Figure 3:
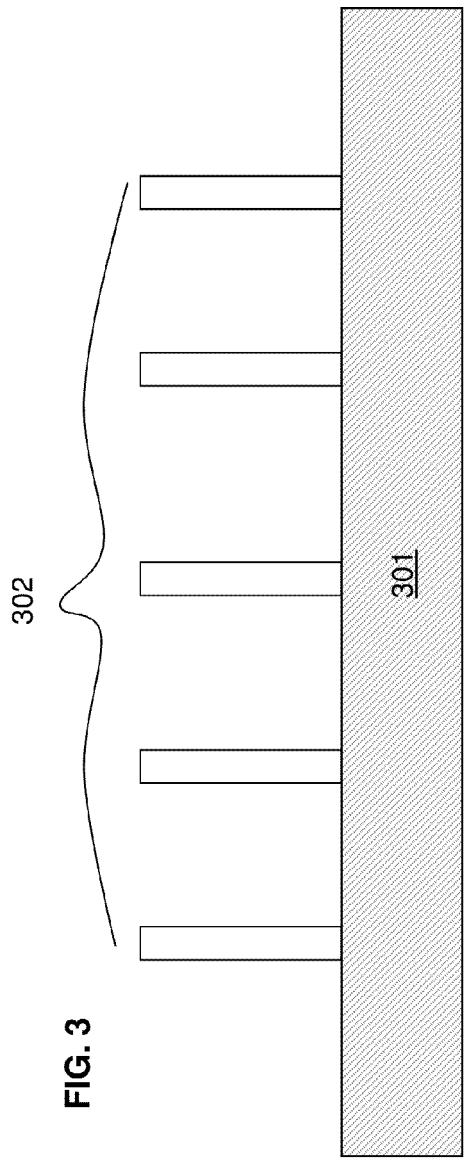
FIG. 3 is a schematic diagram illustrating a cross section of silicon fins in embodiments herein.

FIG. 3 represents a cross section of an exemplary initial step in a method of manufacture of a fin-type PIN diode array, where a plurality of parallel silicon fins 302, doped with ions of a first electrical charge, may be formed on and above a planar substrate 301. A particular photolithographic manufacturing process associated with a particular node technology of FinFET manufacturing technology, e.g., a sidewall image transfer process, determines the minimal distance between each of the parallel silicon fins 302, which is related to the device density of the fin-type PIN diode array to be manufactured. The substrate 201 may comprise one of: bulk silicon and the insulator layer of a silicon-on-insulator (SOI) substrate.

Figure 4B:
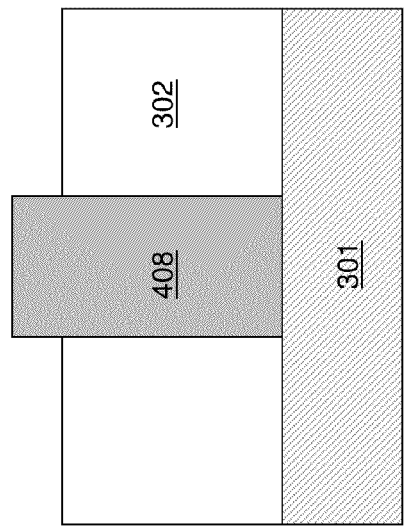
FIG. 4B is a schematic diagram illustrating a side view of the polysilicon dummy gate formed on the silicon fin in embodiments herein.
Figure 4A:
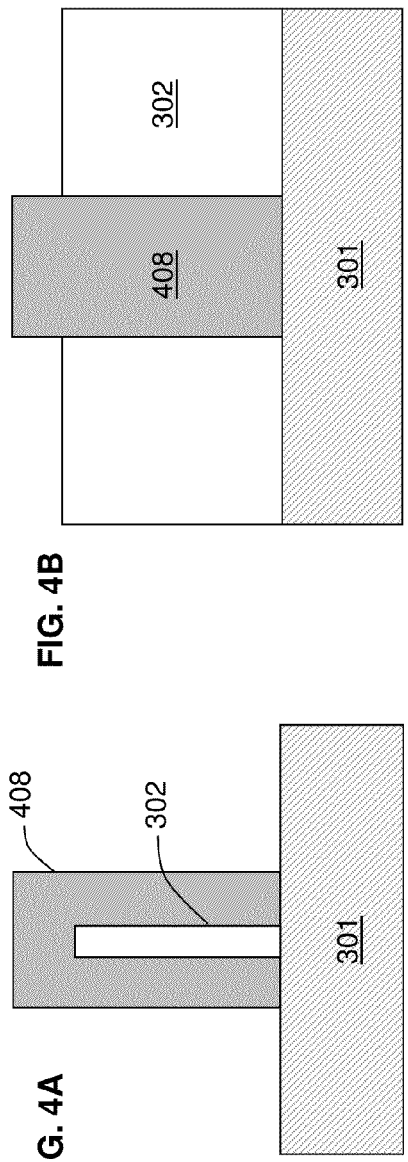
FIG. 4A is a schematic diagram illustrating a cross section of silicon fin covered by a polysilicon dummy gate in embodiments herein.

FIGS. 4A and 4B illustrate an exemplary one of a plurality of polysilicon dummy gates 408 that are formed at intervals along the length of each silicon fin 302 of the plurality of parallel silicon fins 302, respectively, in a cross section that is parallel to the width and height of the silicon fin 302 and disposed on the midpoint of the dummy gate's length, and in a side view that is parallel to the length and height of each silicon fin 302 and disposed on the midpoint of each silicon fin's width. Each polysilicon dummy gate 408 may prevent the epitaxial growth of silicon from the side and top surfaces of a silicon fin 302 in a subsequent process.

Figure 5A:
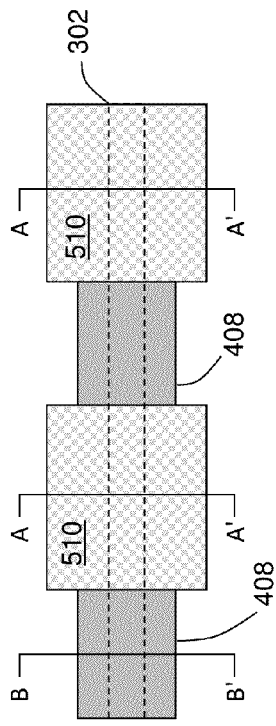
FIG. 5A is a schematic diagram illustrating a top view of a length of silicon fin covered by polysilicon gates and undoped epitaxial growths of silicon in embodiments herein.
Figure 5C:
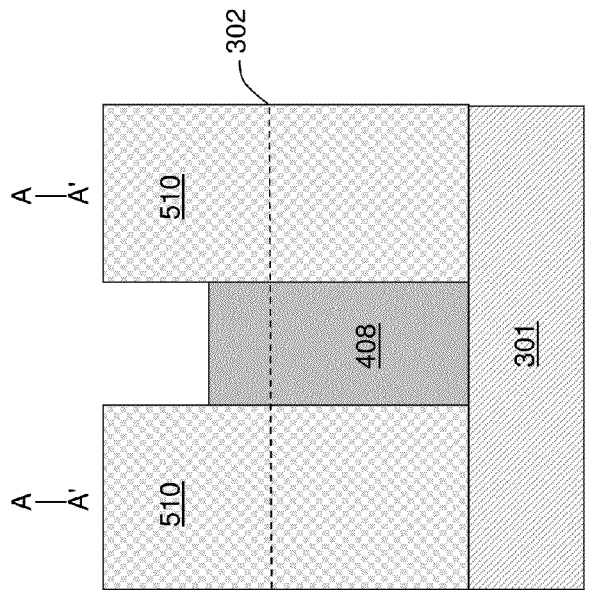
FIG. 5C is a schematic diagram illustrating a side view of a length of silicon fin covered by polysilicon gates and undoped epitaxial growths of silicon in embodiments herein.
Figure 5B:
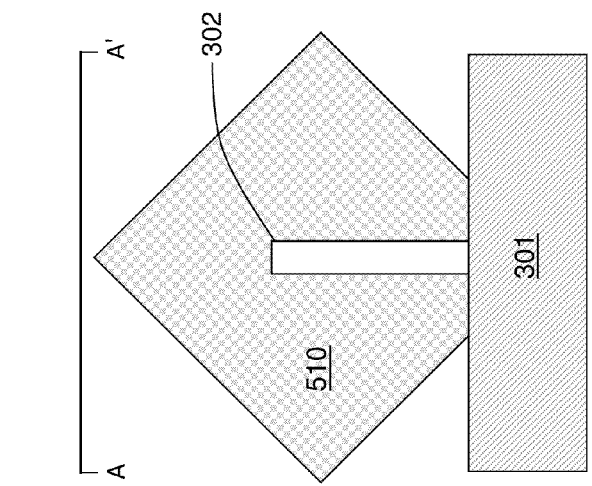
FIG. 5B is a schematic diagram illustrating a cross section of an undoped epitaxial growths of silicon formed on a silicon fin in embodiments herein.

FIG. 5A represents a top view of an exemplary single crystalline silicon fin 302, upon which a pair of undoped epitaxial growths of crystalline silicon 510 is formed on the side and top surfaces of silicon fin 302 between those portions of silicon fin 302 upon which polysilicon dummy gates 408 are formed. The conditions of epitaxial growth are such that each undoped epitaxial growth of crystalline silicon 510 along the length of each crystalline silicon fin 302 exceeds the height of a polysilicon dummy gate 408 formed on each silicon fin 302. Thus, in the top view of FIG. 5A, either a polysilicon dummy gate 408 or an undoped epitaxial growth of crystalline silicon 510 covers each silicon fin 302. The cross section of FIG. 5B corresponds to the construction lines A-A' of FIG. 5A, located at the midpoint of the length of each undoped epitaxial growth of crystalline silicon 510. The undoped epitaxial growth of crystalline silicon 510 is seeded by the crystalline structure of silicon fin 302 and will assume the same crystalline structure as that of crystalline silicon fin 302. The side view of FIG. 5C illustrates that each undoped epitaxial growths of silicon 510 exceeds the height of the interposed dummy gate 408, which in turn, is higher than silicon fin 302.

Referring to the exemplary cross section and side views of FIGS. 6A and 6B, respectively, a silicon nitride liner 612 is deposited on the upper surfaces of the undoped epitaxial growths of crystalline silicon 510 and the polysilicon dummy gates 408, which cover a length of each silicon fin 302. Following deposition of the silicon nitride liner 612, a silicon oxide fill 614 is deposited on the upper surfaces of the silicon nitride liner 612 and the planar substrate 301. The silicon oxide fill 614 then undergoes a chemical and mechanical polish (CMP) to the level of the silicon nitride liner 612 and a subsequent etch exposes the uppermost portions of the silicon nitride liner 612.

Figures 7A, 7B:
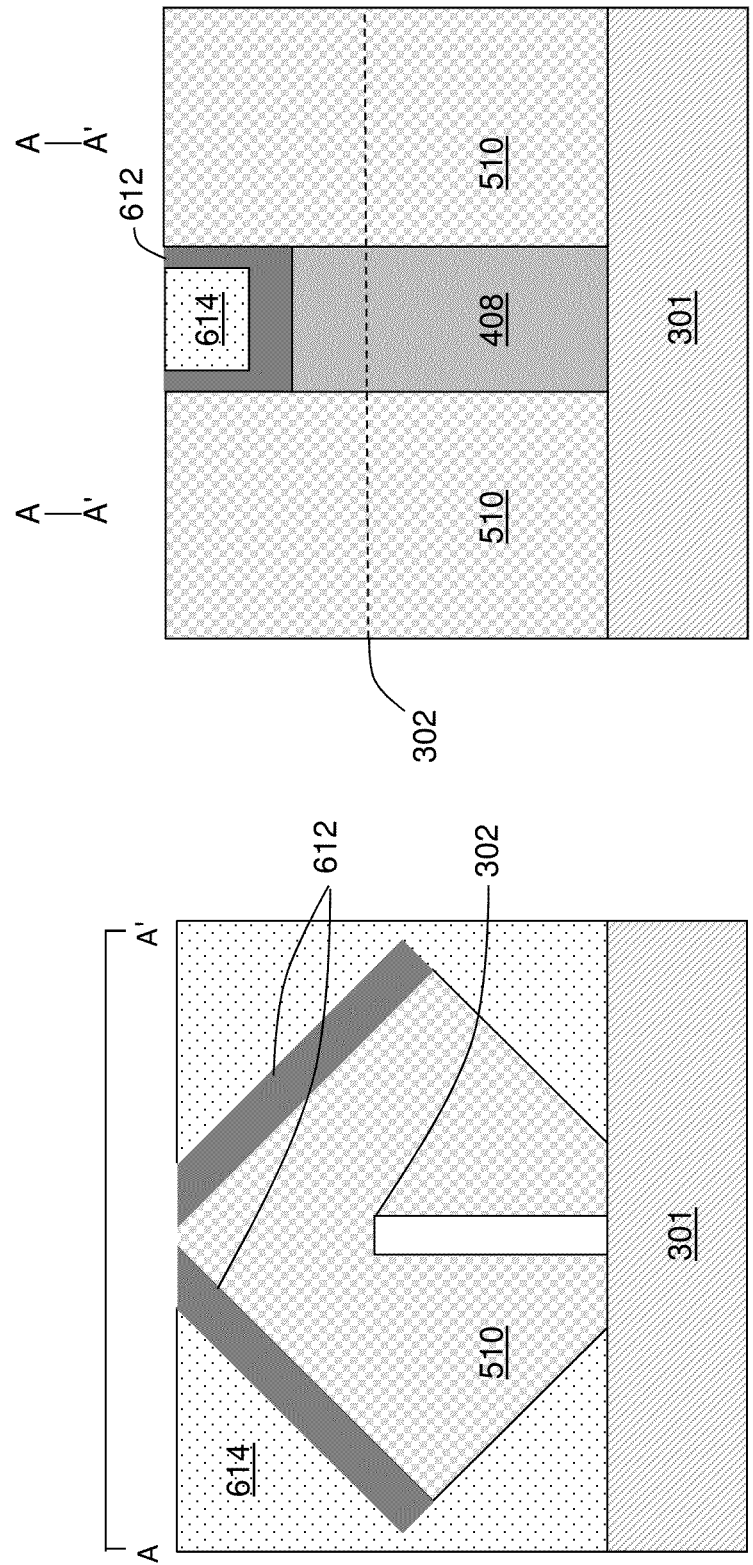
FIG. 7A is a schematic diagram illustrating a cross section of an uppermost exposed portion of an epitaxial growth of silicon in embodiments herein.
FIG. 7B is a schematic diagram illustrating a side view of the uppermost exposed portion of an epitaxial growth of silicon in embodiments herein.

Referring to the exemplary cross section and side views of FIGS. 7A and 7B, respectively, the silicon nitride liner 612 undergoes an etch that exposes an uppermost portion of each undoped epitaxial growth of crystalline silicon 510 that is centered above a length of the underlying silicon fin 302.

Figure 8B:
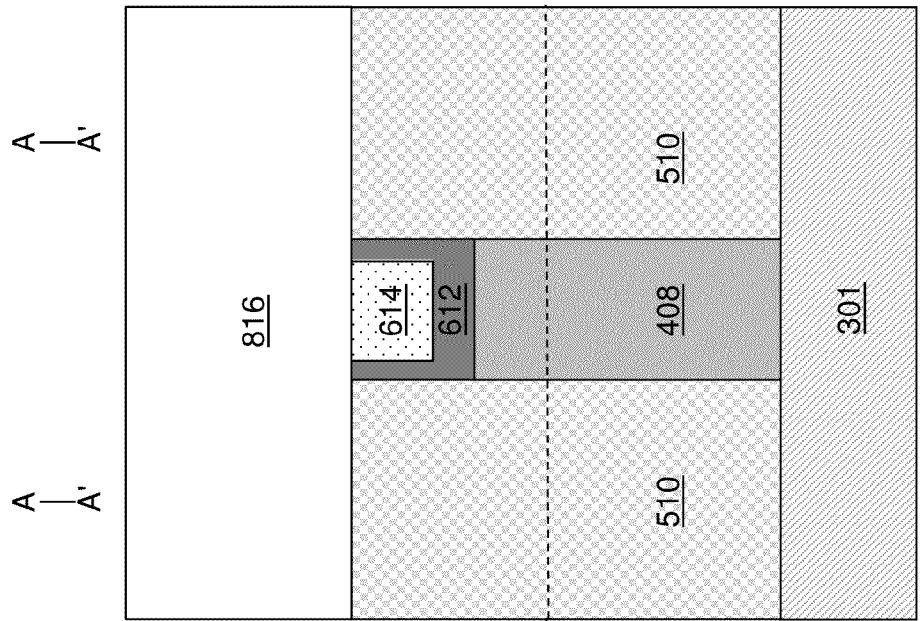
FIG. 8B is a schematic diagram illustrating a side view of the polysilicon layer formed on the uppermost exposed portion of an epitaxial growth of silicon in embodiments herein.
Figure 8A:
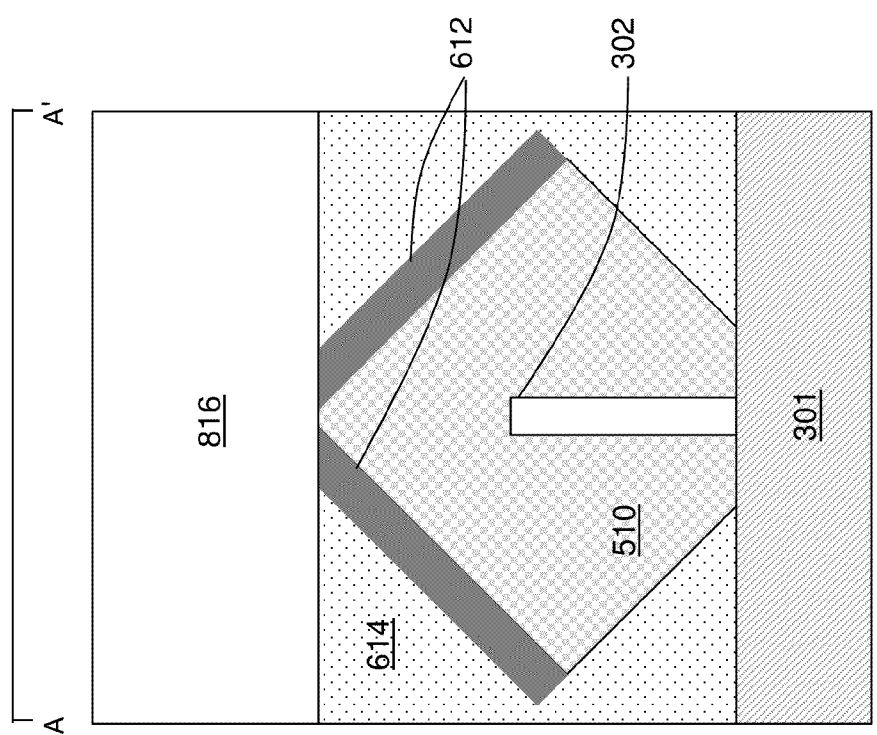
FIG. 8A is a schematic diagram illustrating a cross section of a polysilicon layer formed on the uppermost exposed portion of an epitaxial growth of silicon in embodiments herein.

FIGS. 8A and 8B illustrate a deposition of a polysilicon layer 816, doped with ions of a second electrical charge, on the uppermost surfaces of the structures of FIGS. 7A and 7B, respectively, including an uppermost surface of each undoped epitaxial growth of crystalline silicon 510, the silicon nitride liner 612, and the silicon oxide fill 614. The polysilicon layer 816, doped with ions of the second electrical charge, may undergo a chemical mechanical polish (CMP). The CMP may be followed by an anneal to re-crystallize the polysilicon layer 816 from the underlying exposed portions of each undoped epitaxial growth of crystalline silicon 510, which acts as a seed, to form a re-crystallized polysilicon layer 816, doped with ions of the second electrical charge.

FIG. 9B illustrates the patterning of fins 816 from the re-crystallized polysilicon layer 816, doped with ions of the second electrical charge, on the side view structure of FIG. 8B. A particular photolithographic manufacturing process, associated with a particular node technology of FinFET manufacturing technology, e.g., a sidewall image transfer process, determines the minimal distance between each of the parallel re-crystallized polysilicon silicon fins 816, which is related to the device density of the fin-type PIN diode array to be manufactured. As the re-crystallized polysilicon fins 816 are oriented perpendicularly to the underlying crystalline silicon fins 302, the side view of FIG. 9 now illustrates a cross section of polysilicon fins 816, while the cross section of FIG. 9A, now illustrates the length and height of a single polysilicon fin 816. Each recrystallized polysilicon fin 816, doped with ions of the second electrical charge, contacts a portion of the undoped epitaxial growth of crystalline silicon 510, which may form a depleted intrinsic semiconductor region 906, indicated by the dashed lines. Each depleted intrinsic semiconductor region 906, in turn, contacts at least the top surface of an underlying crystalline silicon fin 302, doped with ions of the first electrical charge. Thus, at each cross connect of a portion of one of the plurality of re-crystallized polysilicon fins 816 and a corresponding portion of one of the underlying, perpendicularly oriented plurality of crystalline silicon fins 302, a vertical PIN diode is formed. Each vertical PIN diode comprises: a portion of an upper recrystallized polysilicon fin 816, doped with ions of the second electrical charge; a connecting portion of the undoped epitaxial growth of crystalline silicon 510, which acts as a depleted intrinsic semiconductor region 906, and a connecting portion of the lower crystalline silicon fin 302, doped with ions of the first electrical charge.

Figures 10A, 10B:
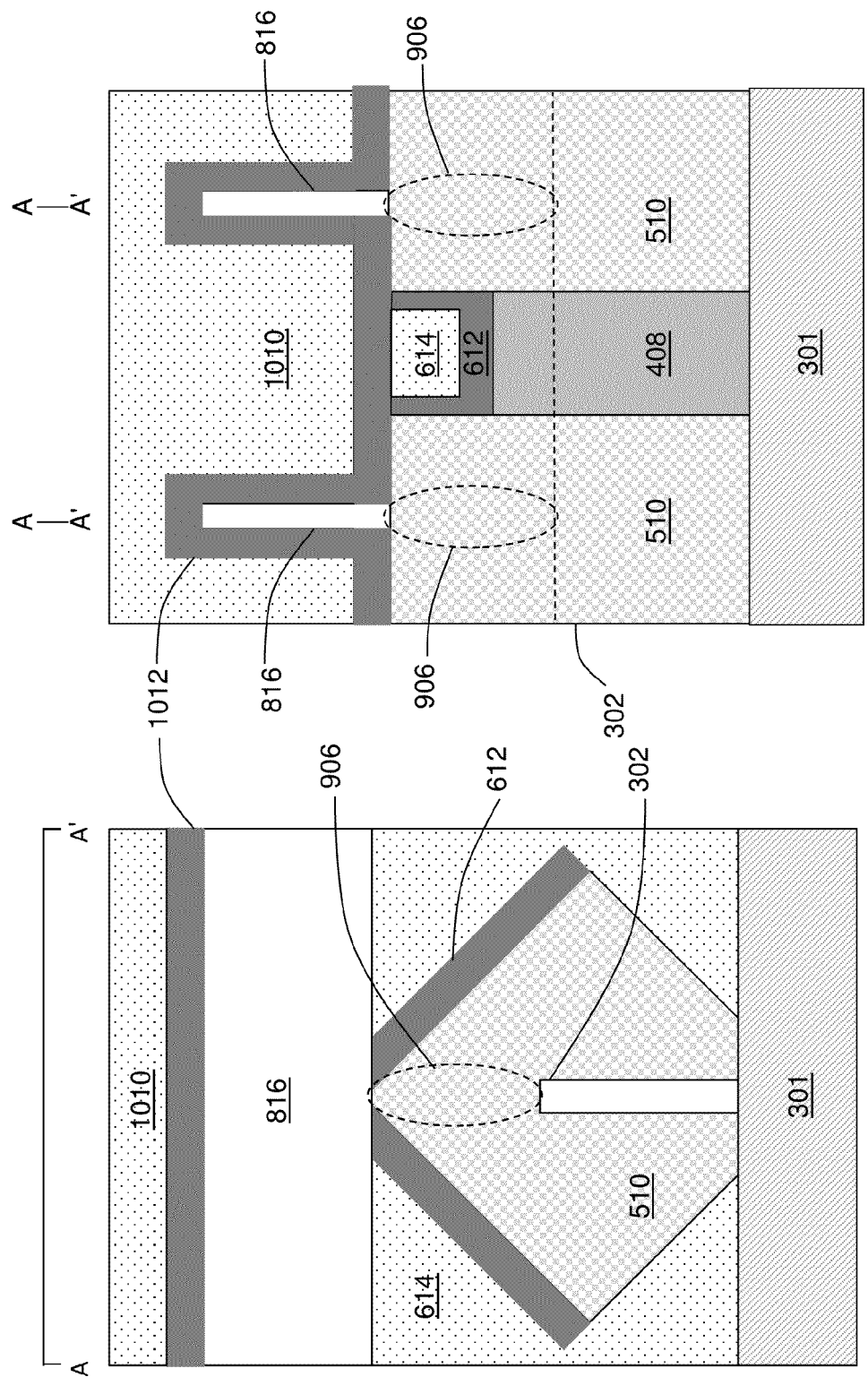
FIG. 10A is a schematic diagram illustrating a cross section of a second nitride layer and a second oxide fill formed on the re-crystallized polysilicon fin in embodiments herein.
FIG. 10B is a schematic diagram illustrating a side view of a second nitride layer and a second oxide fill formed on the re-crystallized polysilicon fin in embodiments herein.

Referring to the exemplary cross section and side views of FIGS. 10A and 10B, respectively, a second nitride deposition 1012 is performed on the patterned re-crystallized polysilicon fins 816, which in turn is followed by a silicon oxide fill 1010.

FIG. 11A illustrates a top view of an exemplary disposition of a single metal contact 1118, at one end of a single silicon fin 302 of the plurality of silicon fins 302, that extends beyond the array of fin-type PIN diodes, and another exemplary disposition of a pair metal contacts 1118, at one end of each of a pair of polysilicon fins 816, that extends beyond the array of fin-type PIN diodes. Each metal contact 1118 at one end of each one of the plurality of silicon fins 302 may comprise a first terminal for each of the plurality of PIN diodes disposed along the length of each silicon fin 302, where the first terminal may provide a reverse bias and a current path for each of the plurality of PIN diodes disposed along the length of each silicon fin 302. Similarly, each metal contact 1118 at one end of each one of the plurality of polysilicon fins 816 may comprise a second terminal for each of the plurality of PIN diodes disposed along the length of each polysilicon fin 816, where the second terminal may provide a reverse bias and a current path for each of the plurality of PIN diodes disposed along the length of each polysilicon fin 816.

The metal contact 1118 of FIG. 11B may be formed subsequent to an etch of the overlying silicon oxide fill 1010 to a top surface of the polysilicon dummy gate 408. The top surface of the polysilicon dummy gate 408 may be silicided to form a low impedance contact with the metal contact 1118. Similarly, the metal contacts 1118 of FIG. 11C may be formed subsequent to an etch of the overlying silicon oxide fill 1010 through the nitride liner 1012 to a top surface of the re-crystallized polysilicon fin 816. The top surface of the re-crystallized polysilicon fin 816 may be silicided to form a low impedance contact with the metal contact 1118.

An array of fin-type PIN diodes manufactured by the processes described, above, may also comprise an array of fin-type PIN photodetectors that responds to electromagnetic radiation from about 1100 nm to about 250 nm in wavelength. The array of fin-type PIN photodetectors may achieve a high PIN photodetector density based on photolithographic processes similar to those used in the manufacture of FinFETs, e.g., a sidewall image transfer process, to form the plurality of crystalline silicon fins 301, doped with ions of the first electrical charge, and the plurality of re-crystallized polysilicon fins 816, doped with ions of the second electrical charge.

An embodiment of a structure of a fin-type PIN diode array may include a plurality of silicon fins disposed in parallel on a planar substrate in a first direction, each silicon fin being doped with ions of a first electrical charge. The structure may also include a number of undoped epitaxial growths of silicon disposed at intervals along a length of each silicon fin, each undoped epitaxial growth covering both sides and a top surface of a portion of each silicon fin and including a depleted intrinsic region that electrically contacts each silicon fin. Finally, the structure may include a plurality of polysilicon fins disposed in parallel in a second direction, perpendicular to the first direction, where each of the polysilicon fins is doped with ions of a second electrical charge and electrically contacts at intervals along a length of each polysilicon fin an uppermost surface of one of the undoped epitaxial growths of silicon.

In the structure of the fin-type PIN diode array, the planar substrate may comprise one of: bulk silicon and the insulator layer of a silicon-on-insulator (SOI) substrate. The fin-type PIN diode array may further include a number of polysilicon dummy gates alternating with the number of undoped epitaxial growths of silicon along each silicon fin, where each polysilicon dummy gate covers both sides and a top surface of a portion of each silicon fin. In the structure of the fin-type PIN diode array, one end of each of the plurality of silicon fins may be covered by one of the number of polysilicon dummy gates, a top surface of one of the number of polysilicon gates may be silicided and contacted by a metal contact, to provide a reverse bias and a current path to each of the silicon fins. In the structure of the fin-type PIN diode array, a top surface of a portion of one end of each of the plurality of polysilicon fins may be silicided and contacted by a metal contact, to provide a reverse bias and a current path to each of the polysilicon fins.

Another embodiment of a structure of a PIN photodetector array may include a first set of parallel silicon fins oriented in a first direction, doped with ions of a first electrical charge, and formed on a substrate. The structure may also include a second set of parallel polysilicon fins oriented to cross the first direction, doped with ions of a second electrical charge, and formed above the first set of parallel silicon fins. Finally, the structure may include a set of intrinsic semiconductor regions connecting each of the first set of parallel silicon fins and each of the second set of parallel polysilicon fins, where each of the parallel silicon fins and the parallel polysilicon fins cross each other in the PIN photodetector array.

In the structure of the PIN photodetector array, the planar substrate may include one of: bulk silicon and the insulator layer of a silicon-on-insulator (SOI) substrate. In the structure of the PIN photodetector array, the first set of parallel silicon fins may equal N silicon fins, the second set of parallel polysilicon fins may equal M polysilicon fins, and the set of intrinsic semiconductor regions may equal N×M intrinsic semiconductor regions. In the structure of the PIN photodetector array, each of the N×M intrinsic semiconductor regions may be formed within an undoped epitaxial silicon growth along each of the N silicon fins. The structure of the PIN photodetector array may further include N metal contacts at one end of each of the plurality of silicon fins, to provide a reverse bias and a current path to each of the silicon fins. The structure of the PIN photodetector array may further include M metal contacts at one end of each of the plurality of polysilicon fins, to provide a reverse bias and a current path to each of the polysilicon fins.

Figure 12:
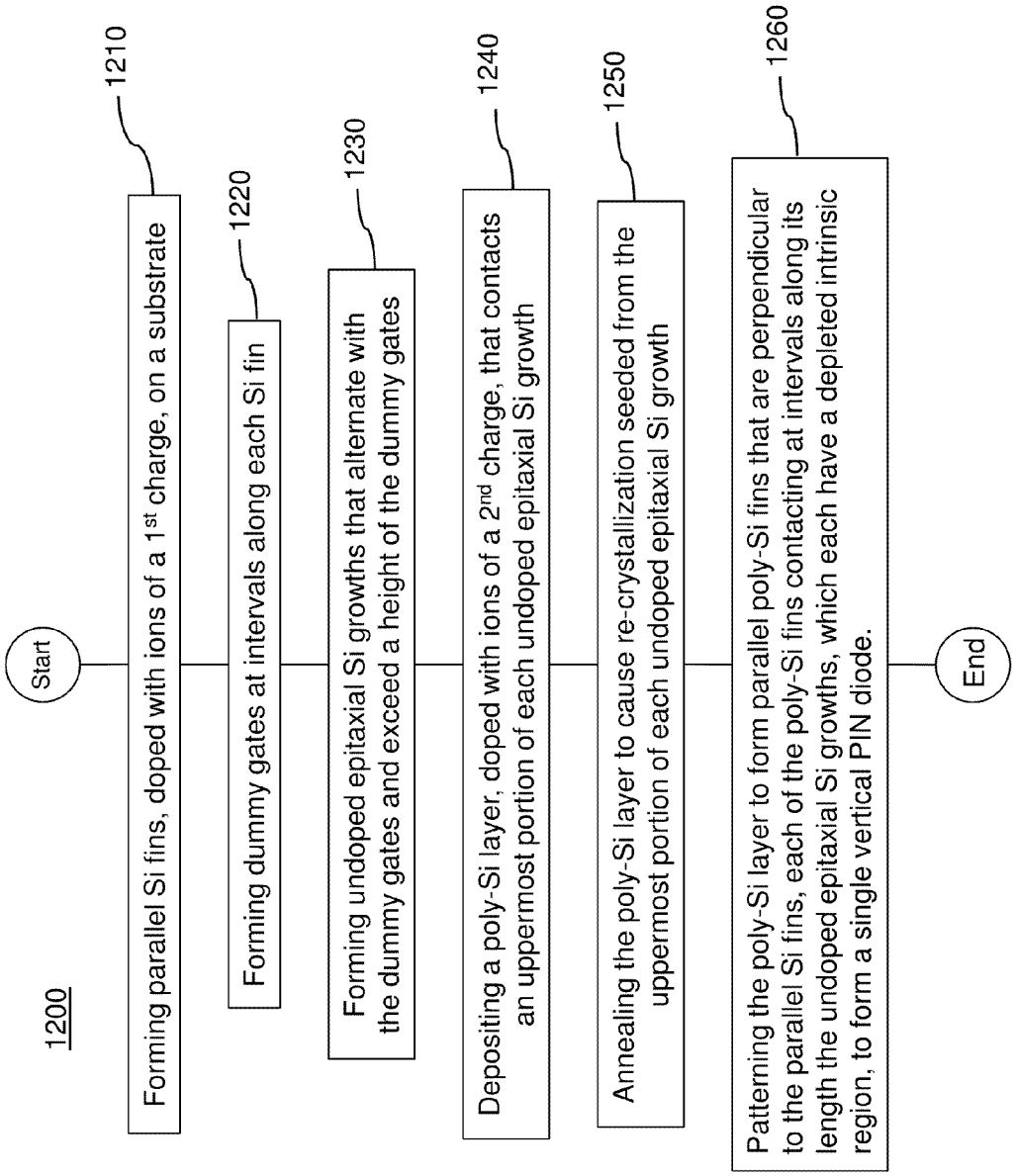
FIG. 12 is a flowchart for the making of a fin-type PIN diode array in embodiments herein.

Referring to FIG. 12, a flowchart 1200 may illustrate a method including forming a plurality of parallel silicon fins, doped with ions of a first electrical charge, on a planar substrate, 1210. The method may also include forming a number of polysilicon dummy gates at intervals along each silicon fin, 1220. The method may further include forming a number of undoped epitaxial silicon growths that alternate with said polysilicon dummy gates and exceed a height of each polysilicon dummy gate, 1230. The method yet may further include depositing a polysilicon layer, doped with ions of a second electrical charge, that contacts an uppermost portion of each undoped epitaxial silicon growth, 1240. The method may yet further include annealing the polysilicon layer to cause re-crystallization seeded from the uppermost portion of each undoped epitaxial silicon growth, 1250. Finally, the method may include patterning the polysilicon layer to form a plurality of parallel polysilicon fins that is perpendicular to the plurality of parallel silicon fins, each of the parallel polysilicon fins contacting at intervals along its length the number of undoped epitaxial silicon growths, each of the undoped epitaxial silicon growths containing a depleted intrinsic region that contacts an overlying one of the plurality of parallel polysilicon fins and an underlying one of the plurality of parallel silicon fins, to form a single PIN structure in an array of PIN diodes, 1260.

In the method, above, the forming of the plurality of parallel silicon fins may result from a photolithographic manufacturing process, associated with a particular FinFET manufacturing technology, that determines a minimal distance between each pair of the parallel silicon fins. In the method, the patterning of the polysilicon layer to form a plurality of parallel polysilicon fins may result from a photolithographic manufacturing process, associated with a particular FinFET manufacturing technology, that determines a minimal distance between each pair of the parallel polysilicon fins. The method may yet further include depositing a nitride liner on upper surfaces of the polysilicon gates and the undoped epitaxial silicon growths, before the depositing of the polysilicon layer and after forming the polysilicon dummy gates and the undoped epitaxial silicon growths. The method may yet further include depositing an oxide fill on the nitride liner, performing a chemical and mechanical polish (CMP) on the oxide fill to a level of the nitride liner, and etching to expose uppermost portions of the nitride liner, before the depositing of the polysilicon layer. The method may yet further include etching the uppermost portions of the nitride liner that are exposed, to further expose an uppermost portion of each undoped epitaxial silicon growth, before the depositing of the polysilicon layer. The method may yet further include depositing a second nitride layer on the plurality of polysilicon fins and upper surfaces of the oxide fill, after the patterning of the polysilicon layer, and depositing of a second oxide fill on the second nitride layer. The method may yet further include forming a silicided metal contact on a polysilicon dummy gate located at one end of each of the plurality of silicon fins that is external to the array of PIN diodes, to provide a reverse bias and a current path to each of the plurality of silicon fins, after depositing the second oxide fill. The method may yet further include forming a silicided metal contact on a top surface of one end of each of the plurality of polysilicon fins that is external to that array of PIN diodes, to provide a reverse bias and a current path to each of the plurality of polysilicon fins, after depositing the second oxide fill.

The methods as described above are used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

A hardmask can be formed of any suitable material, whether now known or developed in the future, such as a metal or organic hardmask, that has a hardness greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a positive resist (illuminated portions remain) or negative resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A fin-type PIN diode array, comprising:
   silicon fins disposed in parallel on a planar substrate in a first direction, each silicon fin being doped with ions of a first electrical charge;
   undoped epitaxial growths of silicon disposed at intervals along a length of each silicon fin, each undoped epitaxial growth covering both sides and a top surface of a portion of each silicon fin and including a depleted intrinsic region that electrically contacts each silicon fin; and
   polysilicon fins disposed in parallel in a second direction, perpendicular to said first direction, each of said polysilicon fins being doped with ions of a second electrical charge and electrically contacting at intervals along a length of each polysilicon fin an uppermost surface of one of said undoped epitaxial growths of silicon.

2. The fin-type PIN diode array of claim 1, said planar substrate comprising one of: bulk silicon and the insulator layer of a silicon-on-insulator (SOI) substrate.

3. The fin-type PIN diode array of claim 1, further comprising polysilicon dummy gates alternating with said undoped epitaxial growths of silicon along each silicon fin, each polysilicon dummy gate covering both sides and a top surface of a portion of each silicon fin.

4. The fin-type PIN diode array of claim 3, one end of each of said silicon fins being covered by one of said polysilicon dummy gates, a top surface of said one of said polysilicon gates being silicided and contacted by a metal contact, to provide a reverse bias and a current path to each of said silicon fins.

5. The fin-type PIN diode of claim 1, a top surface of a portion of one end of each of said polysilicon fins being silicided and contacted by a metal contact, to provide a reverse bias and a current path to each of said polysilicon fins.

6. A PIN photodetector array, comprising:
   a first set of parallel silicon fins oriented in a first direction, doped with ions of a first electrical charge, and formed on a substrate;
   a second set of parallel polysilicon fins oriented to cross said first direction, doped with ions of a second electrical charge, and formed above said first set of parallel silicon fins; and
   a set of intrinsic semiconductor regions connecting each of said first set of parallel silicon fins and each of said second set of parallel polysilicon fins, where each of said parallel silicon fins and said parallel polysilicon fins cross each other in said PIN photodetector array.

7. The PIN photodetector array of claim 6, said substrate comprising one of: bulk silicon and the insulator layer of a silicon-on-insulator (SOI) substrate.

8. The PIN photodetector array of claim 6, said first set of parallel silicon fins equaling N silicon fins, said second set of parallel polysilicon fins equaling M polysilicon fins, and said set of intrinsic semiconductor regions equaling N×M intrinsic semiconductor regions.

9. The PIN photodetector array of claim 8, each of said N×M intrinsic semiconductor regions being formed within an undoped epitaxial silicon growth along each of said N silicon fins.

10. The PIN photodetector array of claim 8, further comprising N metal contacts at one end of each of said N silicon fins, to provide a reverse bias and a current path to each of said silicon fins.

11. The PIN photodetector array of claim 8, further comprising M metal contacts at one end of each of said M polysilicon fins, to provide a reverse bias and a current path to each of said polysilicon fins.

12. A method, comprising:
   forming parallel silicon fins, doped with ions of a first electrical charge, on a planar substrate;
   forming polysilicon dummy gates at intervals along each silicon fin;
   forming undoped epitaxial silicon growths that alternate with said polysilicon dummy gates and exceed a height of each polysilicon dummy gate;

depositing a polysilicon layer, doped with ions of a second electrical charge, that contacts an uppermost portion of each undoped epitaxial silicon growth;

annealing said polysilicon layer to cause re-crystallization seeded from said uppermost portion each undoped epitaxial silicon growth; and patterning said polysilicon layer to form parallel polysilicon fins that are perpendicular to said parallel silicon fins, each of said parallel polysilicon fins contacting at intervals along its length said undoped epitaxial silicon growths, each of said undoped epitaxial silicon growths containing a depleted intrinsic region that contacts an overlying one of said parallel polysilicon fins and an underlying one of said parallel silicon fins, to form a single PIN structure in an array of PIN diodes.

13. The method of claim 12, said forming of said parallel silicon fins resulting a from photolithographic manufacturing process, associated with a particular FinFET manufacturing technology, that determines a minimal distance between each pair of said parallel silicon fins.

14. The method of claim 12, said patterning of said polysilicon layer to form said parallel polysilicon fins, resulting from a photolithographic manufacturing process, associated with a particular FinFET manufacturing technology, that determines a minimal distance between each pair of said parallel polysilicon fins.

15. The method of claim 12, further comprising depositing a nitride liner on upper surfaces of said polysilicon gates and said undoped epitaxial silicon growths, before said depositing of said polysilicon layer and after forming said polysilicon dummy gates and said undoped epitaxial silicon growths.

16. The method of claim 15, further comprising depositing an oxide fill on said nitride liner, performing a chemical and mechanical polish (CMP) on said oxide fill to a level of said nitride liner, and etching to expose uppermost portions of said nitride liner, before said depositing of said polysilicon layer.

17. The method of claim 16, further comprising etching said uppermost portions of said nitride liner that are exposed, to further expose an uppermost portion of each undoped epitaxial silicon growth, before said depositing of said polysilicon layer.

18. The method of claim 16, further comprising depositing a second nitride layer on said plurality of polysilicon fins and upper surfaces of said oxide fill, after said patterning said polysilicon layer and depositing a second oxide fill on said second nitride layer.

19. The method of claim 18, further comprising forming a silicided metal contact on a polysilicon dummy gate located at one end of each of said silicon fins that is external to said array of PIN diodes, to provide a reverse bias and a current path to each of said silicon fins, after depositing said second oxide fill.

20. The method of claim 18, further comprising forming a silicided metal contact on a top surface of one end of each of said polysilicon fins that is external to said array of PIN diodes, to provide a reverse bias and a current path to each of said polysilicon fins, after depositing said second oxide fill.

* * * * *